(12) United States Patent
An et al.

(10) Patent No.: US 10,192,492 B2
(45) Date of Patent: *Jan. 29, 2019

(54) ORGANIC LIGHT EMITTING DIODE DISPLAY

(71) Applicant: Samsung Display Co., Ltd., Yongin-si, Gyeonggi-do (KR)

(72) Inventors: Jin Sung An, Seongnam-si (KR); Min Ho Ko, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/965,778

(22) Filed: Apr. 27, 2018

(65) Prior Publication Data

US 2018/0247597 A1   Aug. 30, 2018

Related U.S. Application Data

(63) Continuation of application No. 14/789,567, filed on Jul. 1, 2015, now Pat. No. 9,959,813.

(30) Foreign Application Priority Data

Jan. 26, 2015 (KR) .................. 10-2015-0012377

(51) Int. Cl.
*G09G 3/3291* (2016.01)
*H01L 27/32* (2006.01)
*G09G 3/3233* (2016.01)

(52) U.S. Cl.
CPC ........ *G09G 3/3291* (2013.01); *G09G 3/3233* (2013.01); *H01L 27/3223* (2013.01);
(Continued)

(58) Field of Classification Search
None
See application file for complete search history.

(56) References Cited

U.S. PATENT DOCUMENTS 8,711,138 B2   4/2014 Kawabe
9,806,141 B2 * 10/2017 Oh ..................... H01L 27/3276
(Continued)

FOREIGN PATENT DOCUMENTS

JP   2012-141456 A   7/2012
JP   5206446 B2   6/2013
(Continued)

*Primary Examiner* — Jennifer Mehmood
*Assistant Examiner* — Parul H Gupta
(74) *Attorney, Agent, or Firm* — Lewis Roca Rothgerber Christie LLP

(57) ABSTRACT

An organic light emitting diode display including: a substrate including a pixel part for displaying an image and a peripheral part enclosing the pixel part; a plurality of scan lines formed on the substrate, each for transferring a scan signal; a plurality of data lines for transferring a data voltage, and a plurality of driving voltage lines intersecting the plurality of scan lines for transferring a driving voltage, respectively; a plurality of pixels connected to the plurality of scan lines and the plurality of data lines, respectively and formed in the pixel part; and at least one dummy pixel connected to the plurality of scan lines and the plurality of data lines and formed in the peripheral part.

12 Claims, 13 Drawing Sheets

(52) U.S. Cl.
CPC . *H01L 27/3262* (2013.01); *G09G 2300/0413* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2320/0238* (2013.01); *G09G 2320/043* (2013.01); *H01L 27/3276* (2013.01)

(56) References Cited

U.S. PATENT DOCUMENTS

| | | | | |
|---|---|---|---|---|
| 2004/0012058 | A1* | 1/2004 | Aoki | H01L 27/3276 257/414 |
| 2005/0001247 | A1* | 1/2005 | Ozawa | H01L 51/529 257/291 |
| 2005/0168138 | A1* | 8/2005 | Okunaka | H01L 27/3223 313/504 |
| 2007/0040770 | A1* | 2/2007 | Kim | G09G 3/3233 345/76 |
| 2013/0148049 | A1* | 6/2013 | Abe | G02F 1/136286 349/43 |
| 2014/0346475 | A1* | 11/2014 | Cho | H01L 27/326 257/40 |
| 2014/0347401 | A1* | 11/2014 | Hwang | G09G 3/3233 345/690 |
| 2015/0001540 | A1* | 1/2015 | Chang | G09G 3/20 257/59 |
| 2015/0200239 | A1* | 7/2015 | Jung | H01L 27/3276 257/40 |

FOREIGN PATENT DOCUMENTS

| | | |
|---|---|---|
| KR | 10-0728145 B1 | 6/2007 |
| KR | 10-0751380 B1 | 8/2007 |
| KR | 10-2011-0035956 A | 4/2011 |

\* cited by examiner

ORGANIC LIGHT EMITTING DIODE DISPLAY

CROSS-REFERENCE TO RELATED APPLICATION

This application is a continuation of U.S. patent application Ser. No. 14/789,567, filed Jul. 1, 2015, which claims priority to and the benefit of Korean Patent Application No. 10-2015-0012377, filed Jan. 26, 2015, the entire content of both of which is incorporated herein by reference.

BACKGROUND

1. Field

The present disclosure relates to an organic light emitting diode display device.

2. Description of the Related Art

An organic light emitting diode (OLD) display includes two electrodes and an organic emission layer disposed therebetween. The OLD forms excitons by combining electrons injected from a cathode which is one electrode with holes injected from an anode which is another electrode at the organic emission layer, and emits light by allowing the excitons to emit energy.

The organic light emitting diode display includes a plurality of pixels including an organic light emitting diode (OLD) which includes a cathode, an anode, and an organic emission layer, in which each pixel is provided with a plurality of transistors and a capacitor for driving the organic light emitting diode. The plurality of transistors basically includes a switching transistor and a driving transistor.

As resolution becomes higher by demand, the size of a pixel is reduced and the critical dimension (CD) between wirings is reduced. In particular, in a semiconductor of pixels formed at left and right outermost portions among pixels which are formed in a pixel part, the phenomenon of the width of the semiconductor being thin due to a loading effect at the time of a photolithography process may occur. The loading effect reduces the width of the wirings positioned at the left and right outermost portions of the pixel part having a low wiring density, unlike a central portion of the pixel part. The loading effect occurs due to the difference in amount of a developer used, per unit area. The width of the semiconductor becomes thin due to the loading effect, and thus bright spots occur.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide an organic light emitting diode display capable of solving bright spots of an outermost pixel.

Some exemplary embodiments of the present disclosure provide an organic light emitting diode display, including: a substrate including a pixel part for displaying an image and a peripheral part enclosing the pixel part; a plurality of scan lines formed on the substrate, each for transferring a scan signal; a plurality of data lines for transferring a data voltage; a plurality of driving voltage lines intersecting the plurality of scan lines for transferring a driving voltage; a plurality of pixels connected to the plurality of scan lines and the plurality of data lines, respectively and formed in the pixel part; and at least one dummy pixel connected to the plurality of scan lines and the plurality of data lines and formed in the peripheral part.

The plurality of pixels may include an outermost pixel formed at an outermost portion of the pixel part, and a central pixel positioned at an inner side of the outermost pixel, of the plurality of pixels including a semiconductor, and the dummy pixel adjacent to the outermost pixel includes a dummy semiconductor connected to the semiconductor.

The dummy pixel may be provided with only a dummy semiconductor.

Each of the plurality of pixels may include a switching transistor connected to a respective scan line and a respective data line, a driving transistor connected to the switching transistor, and an organic light emitting diode electrically connected to the driving transistor. The dummy pixel may include: a switching transistor connected to the respective scan line and the respective data line, and a driving transistor connected to the switching transistor.

The dummy pixel may not include any organic light emitting diode.

The organic light emitting diode may include: a pixel electrode electrically connected to the driving transistor, an organic emission layer formed on the pixel electrode, and a common electrode formed on the organic emission layer.

The switching transistor may include: a switching channel formed on the semiconductor; a switching gate electrode formed on the same layer as the respective scan line and overlapping the switching channel; and a switching source electrode and a switching drain electrode formed at both sides of the switching channel, respectively.

The driving transistor may include: a driving channel formed on the semiconductor, a driving gate electrode formed on the same layer as the respective scan line and overlapping the driving channel, and a driving source electrode and a driving drain electrode formed at both sides of the driving channel, respectively.

The organic light emitting diode display may further include: a plurality of initialization voltage lines positioned in the pixel part for transferring an initialization voltage to the plurality of pixels and an initialization bus line positioned at the peripheral part and connecting to the plurality of initialization voltage lines.

The initialization bus line may overlap the dummy pixel.

The organic light emitting diode display may further include: a front end scan line disposed in parallel with the plurality of scan lines for transferring a front end scan signal, and an initialization transistor disposed between the initialization voltage line and a driving gate electrode of the driving transistor, which is turned on depending on the front end scan signal to transfer the initialization voltage to the driving gate electrode.

According to an exemplary embodiment of the present disclosure, it is possible to prevent the width of the semiconductor formed in the outermost pixel PX2 from thinning by forming the dummy semiconductor in the outermost pixel PX2 to alleviate the loading effect. As a result, it is possible to prevent bright spots from occurring in the outermost pixel PX2.

DETAILED DESCRIPTION

Figure 1:
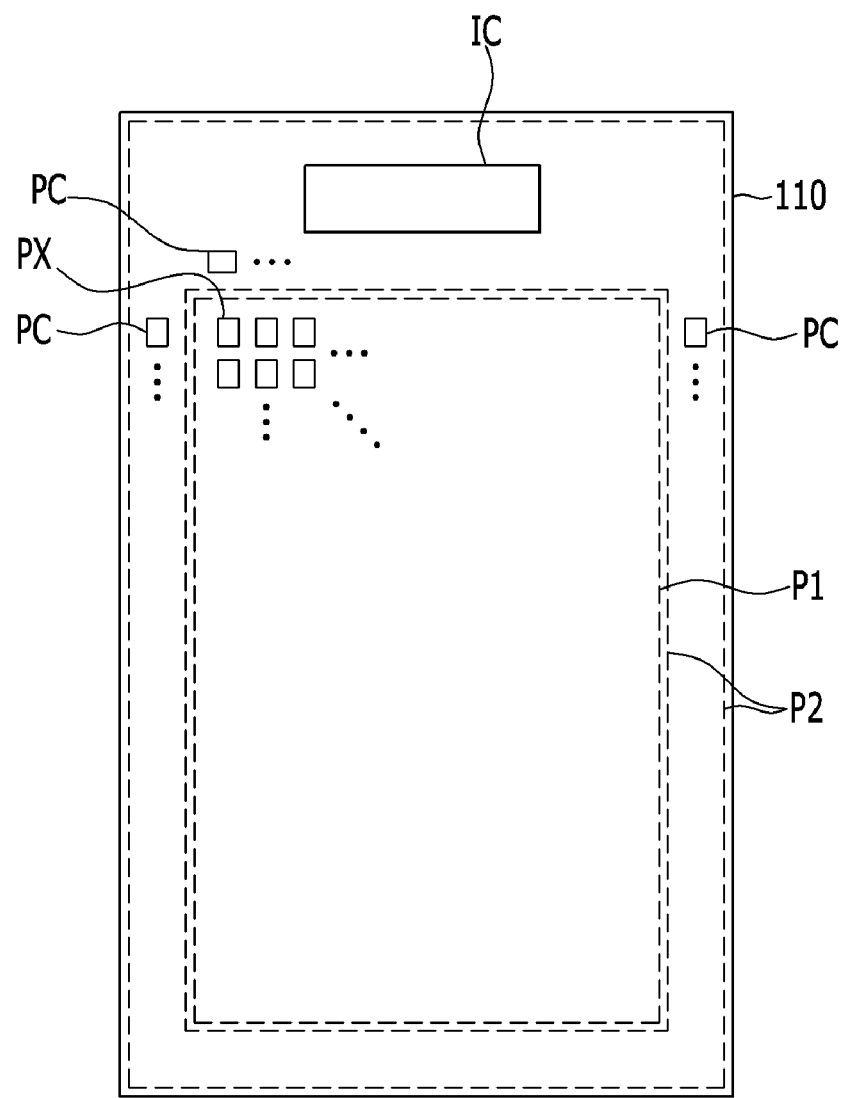
FIG. 1 is an overall plan view of an organic light emitting diode display according to an exemplary embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In addition, the size and thickness of each configuration shown in the drawings are arbitrarily shown for understanding and ease of description, but the present disclosure is not limited thereto. In the drawings, the thickness of layers, films, panels, regions, etc., are exaggerated for clarity. In the drawings, for understanding and ease of description, the thickness of some layers and areas is exaggerated.

In addition, unless explicitly described to the contrary, the word "comprise" and variations such as "comprises" or "comprising", will be understood to imply the inclusion of stated elements but not the exclusion of any other elements. Further, throughout the present specification, it will be understood that when an element such as a layer, film, region, or substrate is referred to as being "on" another element, it can be directly on the other element or intervening elements may also be present. Further, in the specification, the word "~on" or "~over" means positioning on or below the object portion, but does not essentially mean positioning on the upper side of the object portion based on a gravity direction.

Further, throughout the specification, the word "on plane" means viewing an object portion from the top and the word "on section" means viewing a section of an object portion, which is vertically taken along, from a side.

Further, the number of thin film transistors (TFTs) and capacitors is not limited to the number illustrated in the accompanying drawings and an organic light emitting diode display may be formed in various structures in which one pixel may include a plurality of transistors and at least one capacitor and is further provided with a separate wiring or does not include the existing wirings. Here, the pixel means a minimum unit which displays an image and the organic light emitting device displays an image through a plurality of pixels.

Hereinafter, an organic light emitting diode display according to an exemplary embodiment of the present disclosure will be described with reference to the accompanying drawings.

FIG. 1 is an overall plan view of an organic light emitting diode display according to an exemplary embodiment of the present disclosure.

As illustrated in FIG. 1, an organic light emitting diode display according to an exemplary embodiment of the present disclosure includes a pixel part P1, which is formed on a substrate 110 and is provided with a plurality of pixels PXs of an organic light emitting diode (OLD) displaying an image; and a peripheral part P2, which encloses the pixel part P1 and is provided with a plurality of peripheral circuits PCs and a driving circuit chip (IC).

Hereinafter, the pixel part P1 of the organic light emitting diode display according to the exemplary embodiment of the present disclosure will be described in detail.

Figure 2:
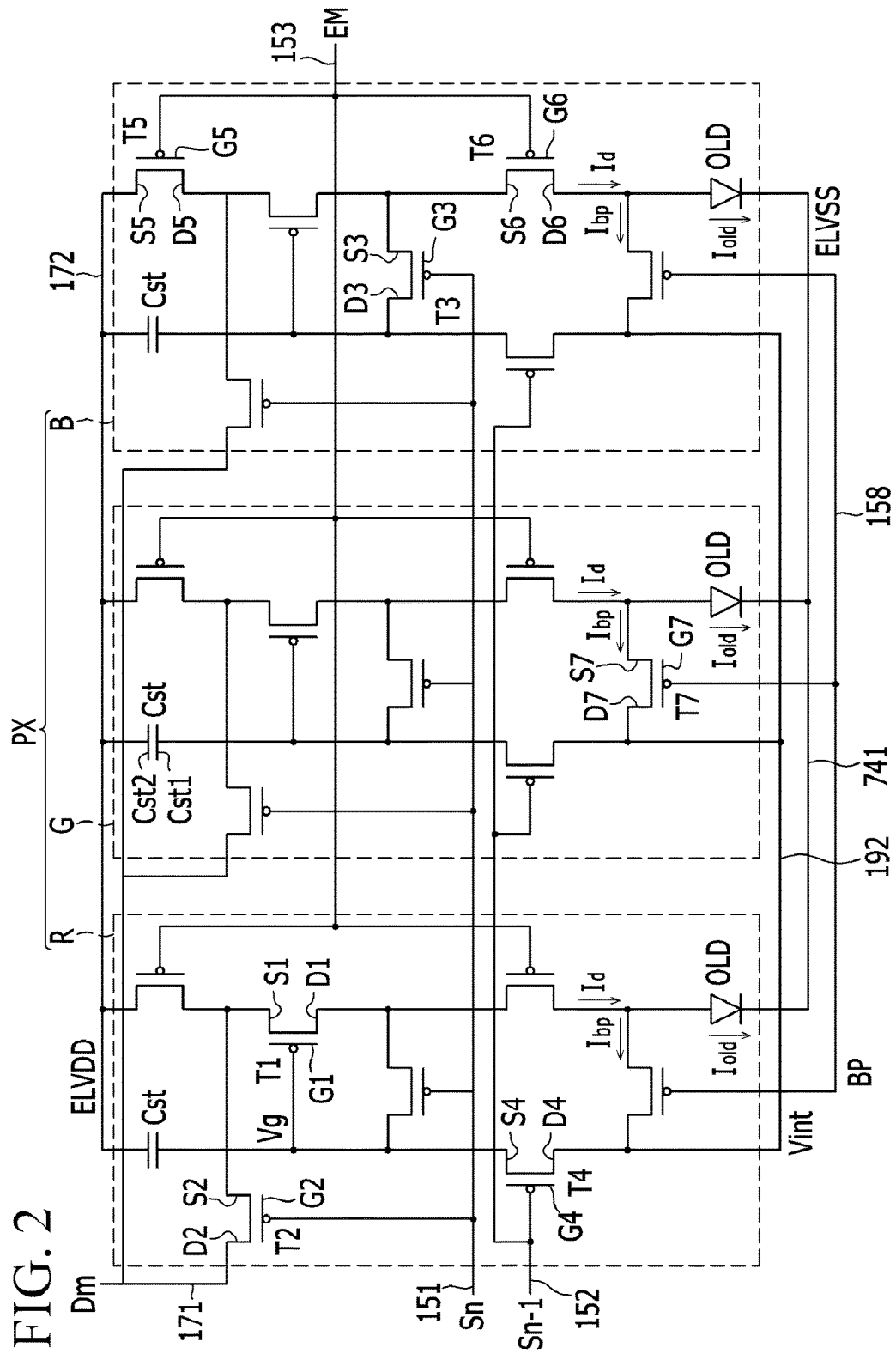
FIG. 2 is an equivalent circuit diagram of a pixel part of an organic light emitting diode display according to an exemplary embodiment of the present disclosure.

FIG. 2 is an equivalent circuit diagram of a pixel part of the organic light emitting diode display according to an exemplary embodiment of the present disclosure.

As illustrated in FIG. 2, the pixel part P1 of the organic light emitting diode display according to the exemplary embodiment of the present disclosure includes a plurality of signal lines 151, 152, 153, 158, 171, 172, and 192 and a plurality of pixels PXs which are connected to a plurality of signal lines and are arranged in approximately in a matrix form. The plurality of pixels PX includes a red pixel R, a green pixel G, and a blue pixel B.

One pixel PX includes a plurality of transistors T1, T2, T3, T4, T5, T6, and T7 which are connected to the plurality of signal lines 151, 152, 153, 158, 171, 172, and 192, a storage capacitor Cst, and an organic light emitting diode (OLD).

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 which transfers a scan signal Sn, a front end scan line 152 which transfers a front end scan signal Sn−1 to the initialization transistor T4, a light emission control line 153 which transfers a light emitting control signal EM to the operation control transistor T5 and the light emission control transistor T6, a bypass control line 158 which transfers a bypass signal BP to the bypass transistor T7, a data line 171 which intersects the scan line 151 and transfers a data signal Dm, a driving voltage line 172 which transfers a driving voltage ELVDD and is formed in approximately parallel with the data line 171, and an initialization voltage line 192 which transfers an initialization voltage Vint for initializing the driving transistor T1.

A gate electrode G1 of the driving transistor T1 is connected to one terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the organic light emitting diode (OLD) via the light emission control transistor T6. The driving transistor T1 receives the data signal Dm, depending on a switching operation of the switching transistor T2, to supply a driving current Id to the organic light emitting diode (OLD).

A gate electrode G2 of the switching transistor T2 is connected to the scan line 151, a source electrode S2 of the switching transistor T2 is connected to the data line 171, a drain electrode D2 of the switching transistor T2 is connected to the driving voltage line 172 via the operation control transistor T5, while being connected to the source electrode S1 of the driving transistor T1. The switching transistor T2 is turned on depending on the scan signal Sn which is transferred through the scan line 151 to perform a switching operation of transferring the data signal Dm transferred to the data line 171 to the source electrode S1 of the driving transistor T1.

A gate electrode G3 of the compensation transistor T3 is connected to the scan line 151, a source electrode S3 of the compensation transistor T3 is connected to the anode of the organic light emitting diode (OLD) via the light emission transistor T6 while being connected to the drain electrode D1 of the driving transistor T1, a drain electrode D3 of the compensation transistor T3 is connected to a drain electrode D4 of the initialization transistor T4, one terminal Cst1 of the storage capacitor Cst, and the gate electrode G1 of the driving transistor T1 together. The compensation transistor T3 is turned on depending on the scan signal Sn which is transferred through the scan line 151 to connect between the gate electrode G1 and the drain electrode D1 of the driving transistor T1 so as to diode-connect the driving transistor T1.

A gate electrode G4 of the transistor T4 is connected to the front end scan line 152, the source electrode S4 of the initialization transistor T4 is connected to the initialization voltage line 192, and the drain electrode D4 of the initialization transistor T4 is connected to one terminal Cst1 of the storage capacitor Cst via the drain electrode D3 of the compensation transistor T3 and the gate electrode G1 of the driving transistor T1 together. The initialization transistor T4 is turned on depending on the front end scan signal Sn−1 which is transferred through the front end scan line 152 to transfer the initialization voltage Vint to the gate electrode G1 of the driving transistor T1 so as to perform the initialization operation which initializes a gate voltage Vg of the gate electrode G1 of the driving transistor T1.

A gate electrode G5 of the operation control transistor T5 is connected to the light emission control line 153, the source electrode S5 of the operation control transistor T5 is connected to the driving voltage line 172, and the drain electrode D5 of the operation control transistor T5 is connected to the source electrode S1 of the driving transistor T1 and the drain electrode S2 of the switching transistor T2.

A gate electrode G6 of the light emission transistor T6 is connected to the light emission control line 153, a source electrode S6 of the light emission transistor T6 is connected to the drain electrode D1 of the driving transistor T1 and the source electrode S3 of the compensation transistor T3, and a drain electrode D6 of the light emission transistor T6 is electrically connected to the anode of the organic light emitting diode (OLD). The operation control transistor T5 and the light emission control transistor T6 are simultaneously turned on depending on the light emission control signal EM which is transferred through the light emission control line 153 and thus the driving voltage ELVDD is compensated by the diode-connected driving transistor T1 and then is transferred to the organic light emitting diode (OLD).

A gate electrode G7 of the bypass transistor T7 is connected to the bypass control line 158, a source electrode S7 of the bypass transistor T7 is connected to the drain electrode D6 of the light emission control transistor T6 and the anode of the organic light emitting diode (OLD) together, and a drain electrode D7 of the bypass transistor T7 is connected to the initialization voltage line 192 and the source electrode S4 of the initialization transistor T4 together.

The other terminal Cst2 of the capacitor Cst is connected to the driving voltage line 172 and a cathode of the organic light emitting diode (OLD) is connected to the common voltage line 741 through which a common voltage ELVSS is transferred.

Hereinafter, a detailed operation of one pixel of the organic light emitting diode display, according to the exemplary embodiment of the present disclosure, will be described in detail with reference to FIG. 3.

Figure 3:
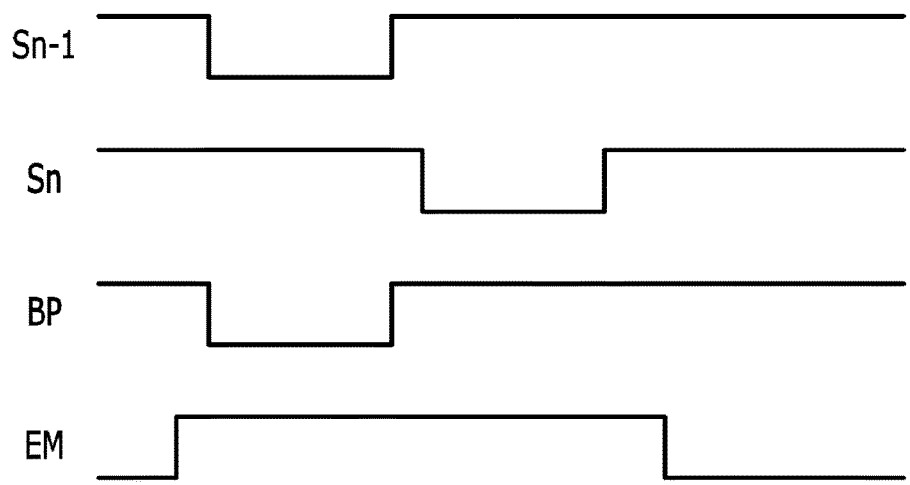
FIG. 3 is a timing diagram of a signal applied to a pixel of an organic light emitting diode display according to an exemplary embodiment of the present disclosure.

FIG. 3 is a timing diagram of a signal applied to a pixel of the organic light emitting diode display according to the exemplary embodiment of the present disclosure.

As illustrated in FIG. 3, first, a low-level front end scan signal Sn−1 is supplied through the front end scan line 152 for an initialization period. Next, the initialization transistor T4 is turned on depending on the low-level front end scan signal Sn−1, the initialization voltage Vint is connected to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period. Next, the switching transistor T2 and the compensation transistor T3 are turned on depending on the low-level scan signal Sn. In this case, the driving transistor T1 is diode-connected by the turned on compensation transistor T3 and is biased forward.

Next, a compensation voltage Dm+Vth (Vth is a negative value), which is reduced as much as a threshold voltage (Vth) of the driving transistor T1 from the data signal Dm supplied from the data line 171, is applied to the gate electrode G1 of the driving transistor T1. That is, the gate voltage Vg, which is applied to the gate electrode G1 of the driving transistor T1, is the compensation voltage Dm+Vth.

The driving voltage ELVDD and the compensation voltage Dm+Vth are applied to both terminals of the storage capacitor Cst and a charge corresponding to the difference in voltage between both terminals of the storage capacitor Cst is stored in the storage capacitor Cst.

Next, the light control signal EM supplied from the light emission control line 153 is changed from a high level to a low level for a light emission period. Next, the operation control transistor T5 and the light control transistor T6 are turned on by the low-level light emission control signal Em for the light emission period.

Next, a driving current Id corresponding to a voltage difference between the gate voltage Vg of the gate electrode G1 of the driving transistor T1 and the driving voltage ELVDD is generated and the driving current Id is supplied to the organic light emitting diode (OLD) through the light emission control transistor T6. A driving gate-source voltage Vgs of the driving transistor T1 is maintained at ((Dm+Vth)−ELVDD) by the storage capacitor Cst for the light emission period. Depending on a current-voltage relationship of the driving transistor T1, the driving current Id is proportional to a square ((Dm−ELVDD)2) of a value obtained by subtracting the threshold voltage from the driving gate-source voltage Vgs. Therefore, the driving current Id is determined independent of the threshold voltage Vth of the driving transistor T1.

In this case, the bypass transistor T7 is turned on based on the bypass signal BP from the bypass control line 158. Thus, the portion of the driving current Id is discharged as the bypass current Ibp through the bypass transistor T7.

When the organic light emitting diode (OLD) emits light, even though a minimum current of the driving transistor T1 displaying a black image flows as a driving current, the black image is not properly displayed. Therefore, the bypass transistor T7 of the organic light emitting diode according to the exemplary embodiment of the present disclosure may disperse some of the minimum current of the driving transistor T1 to other current paths other than a current path to the organic light emitting diode as the bypass current Ibp. Here, the minimum current of the driving transistor T1 means a current under the condition that the driving gate-source voltage Vgs of the driving transistor T1 is smaller than the threshold voltage Vth and thus the driving transistor T1 is turned off. The minimum driving current (e.g., current which is equal to or less than 10 pA), under the condition that the driving transistor T1 is turned off, is transferred to the organic light emitting diode (OLD) and is represented by an image of black luminance. When the minimum driving current representing the black image flows, the effects of the bypass transfer of the bypass current Ibp is large. But, when a large driving current representing an image like a general image or a white image flows, an effect of the bypass current Ibp may be minimal. Therefore, when the driving current representing the black image flows, a light emitting current Iold of the organic light emitting diode (OLD) which is reduced as much a current amount of the bypass current Ibp which exits from the driving current Id through the bypass transistor T7, has a minimum current amount at a level to certainly represent the black image. Therefore, the accurate black luminance image is achieved by using the bypass transistor T7 to improve the contrast ratio of the display. In FIG. 3, the bypass signal BP is the same as the scan signal Sn−1, but is not necessarily limited thereto.

Next, the detailed structure of the outermost pixel PX2 among the plurality of pixels of the organic light emitting diode display illustrated in FIGS. 1 to 3 will be described with reference to FIGS. 6 to 8.

Figure 4:
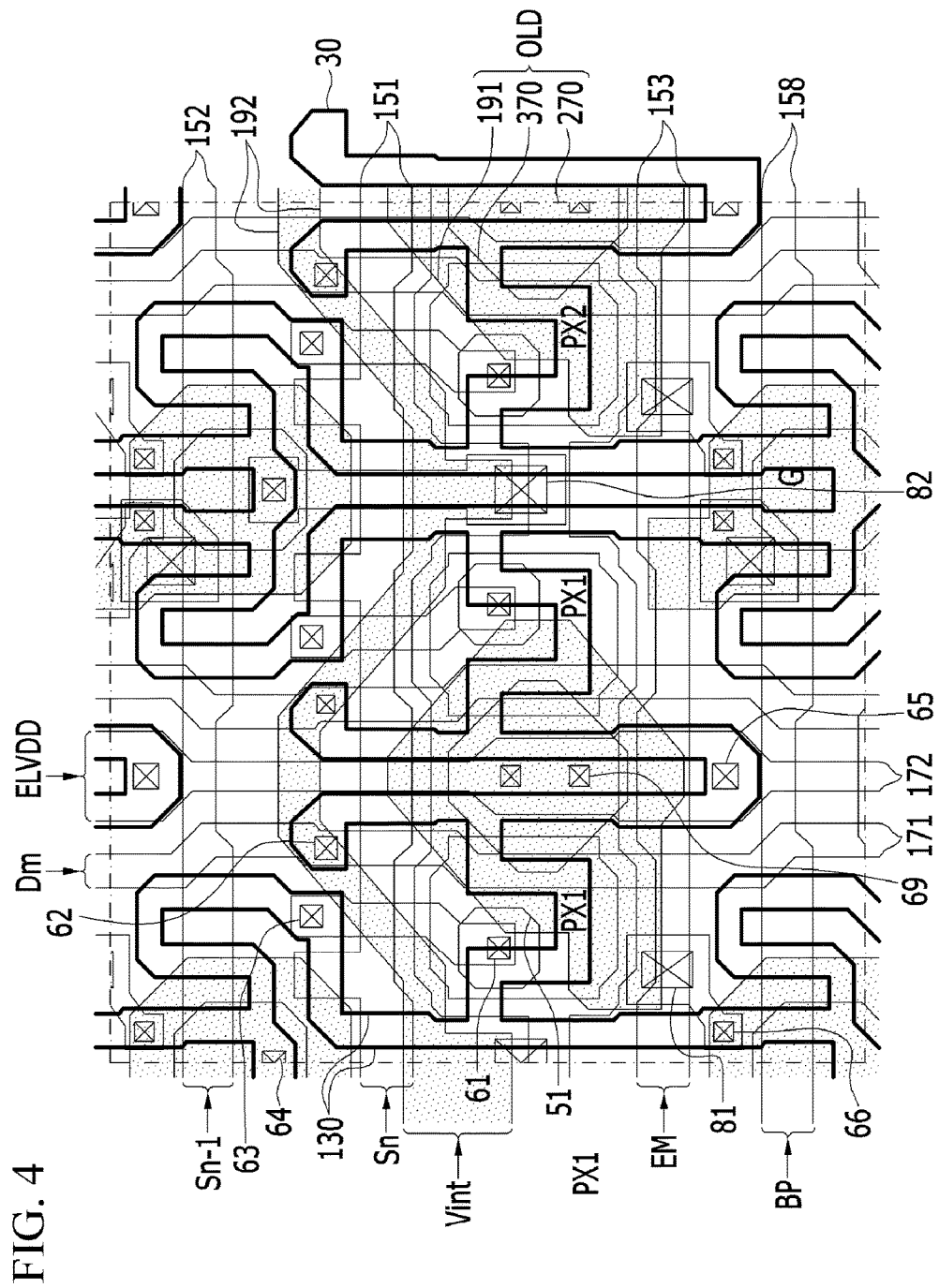
FIG. 4 is a layout view of a transistor and a capacitor forming an outermost pixel PX2 among a plurality of pixels of an organic light emitting diode display according to an exemplary embodiment of the present disclosure.
Figure 5:
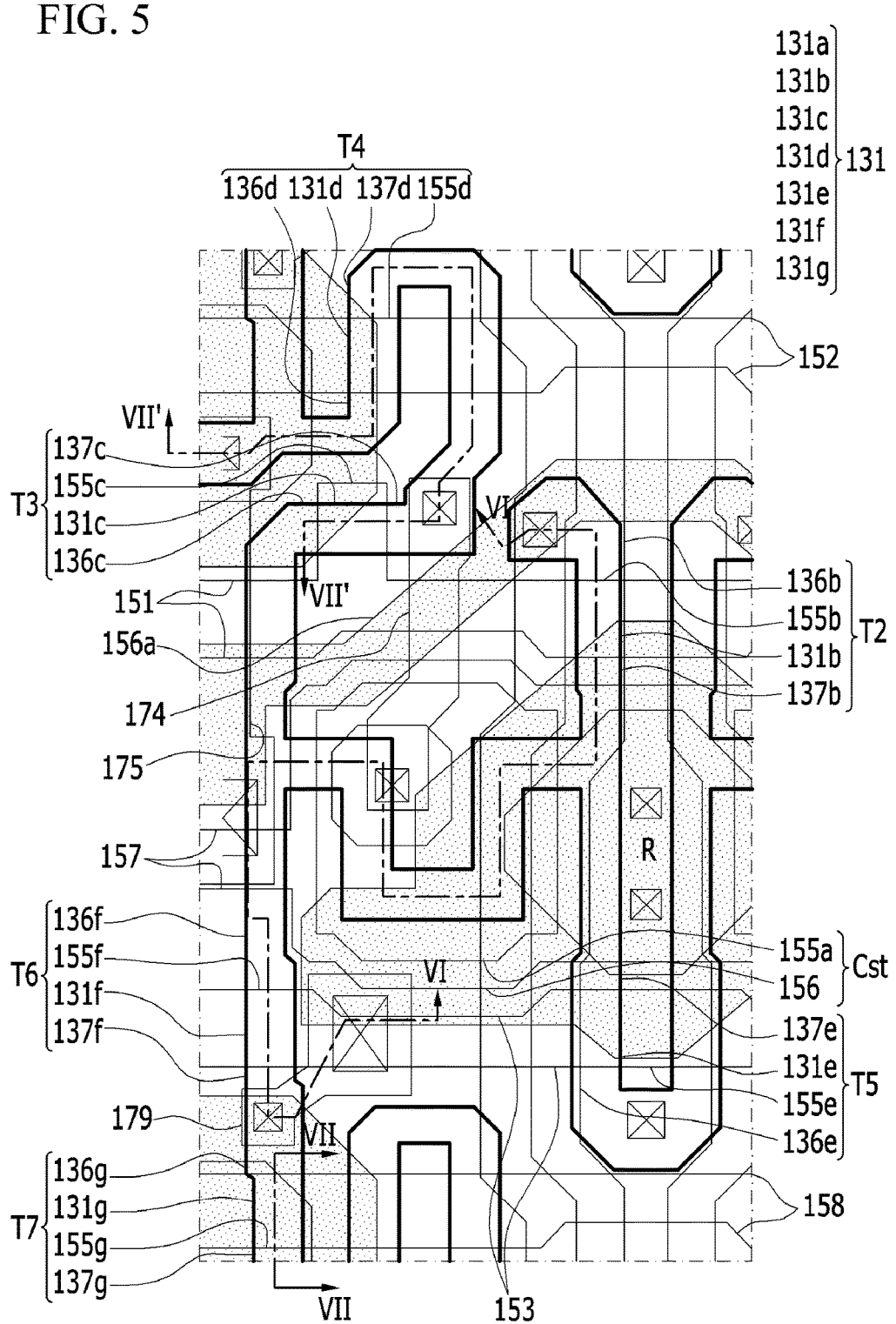
FIG. 5 is a detailed layout view of FIG. 4.
Figure 6:
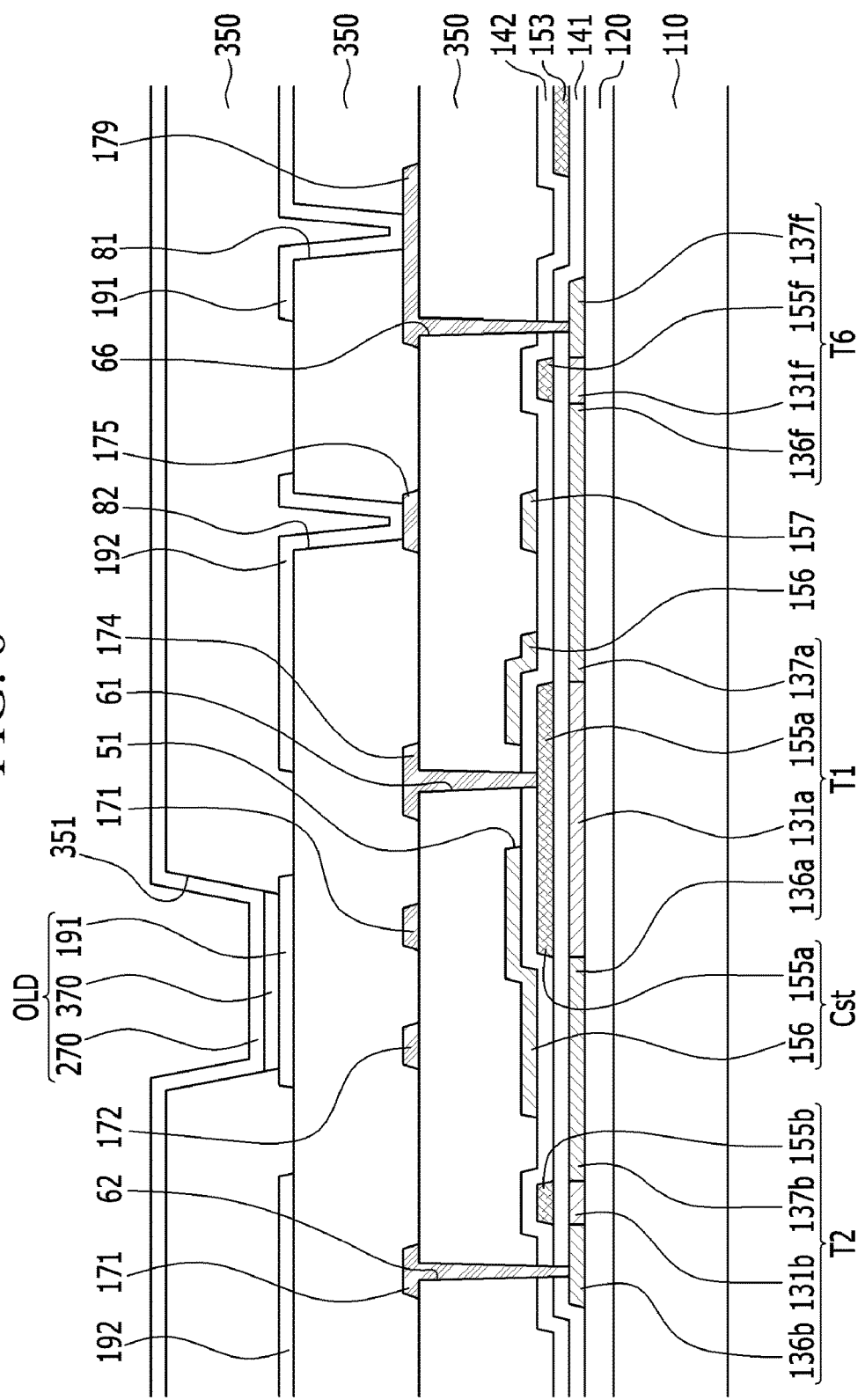
FIG. 6 is a cross-sectional view of the organic light emitting diode of FIG. 5 taken along the line VI-VI.
Figure 7:
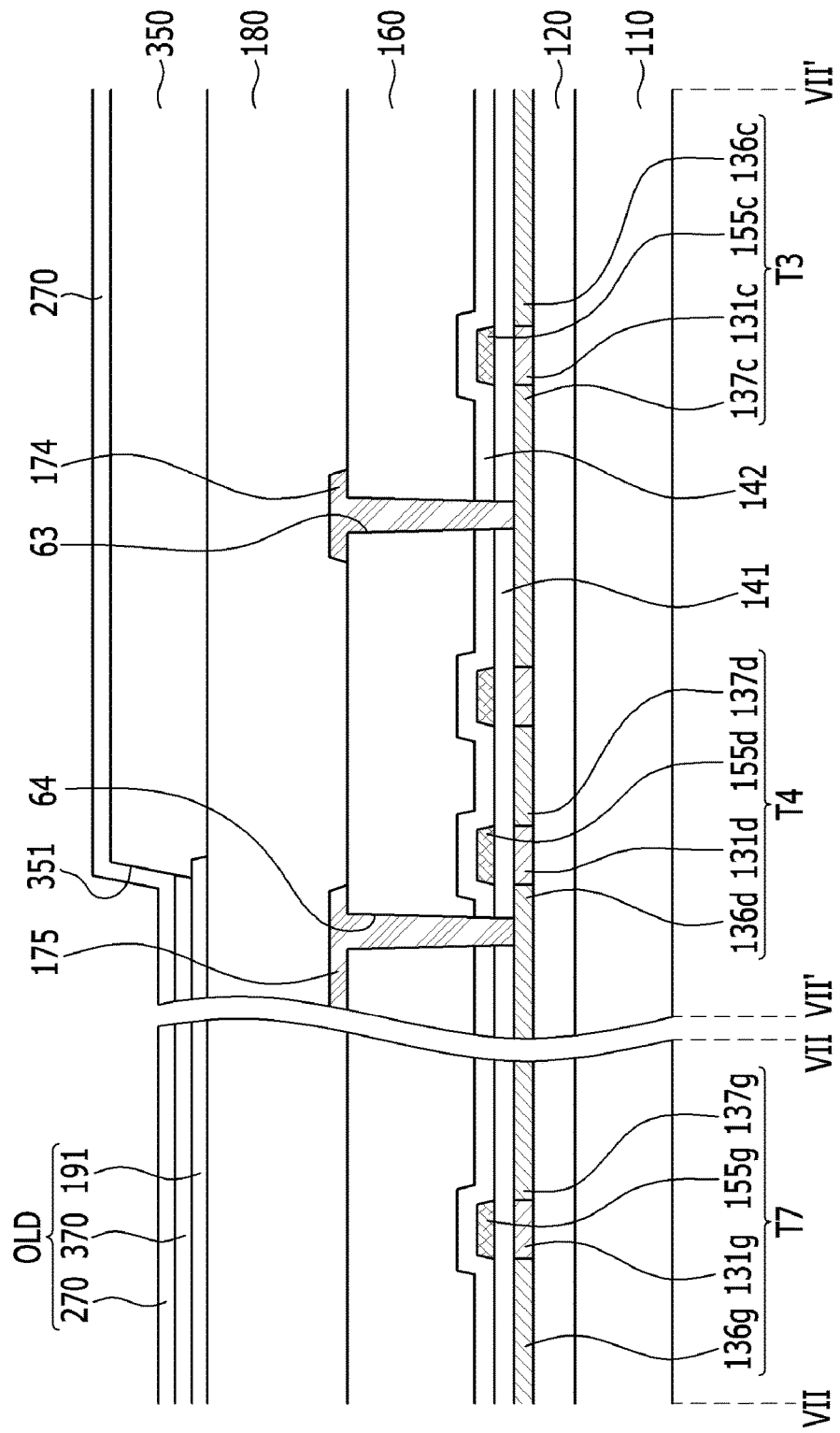
FIG. 7 is a cross-sectional view of the organic light emitting diode of FIG. 5 taken along the lines VII-VII and VII'-VII'.
Figure 8:
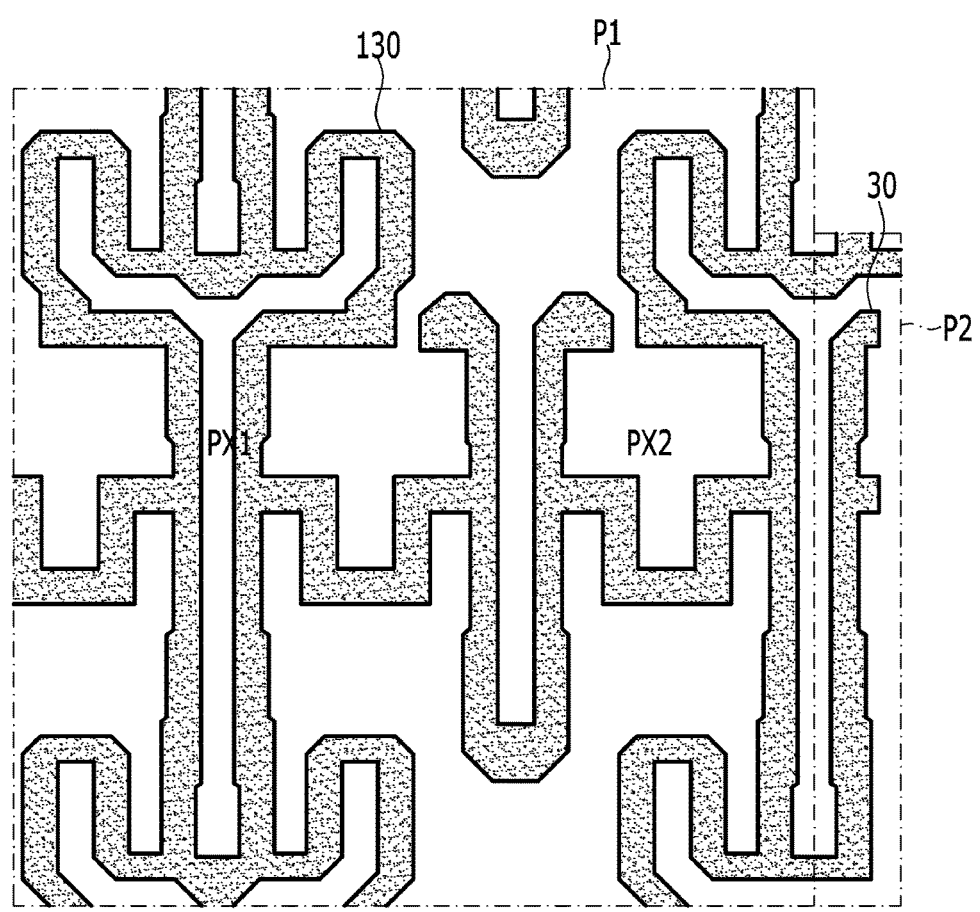
FIG. 8 is a layout view of a semiconductor and a dummy semiconductor of the outermost pixel PX2 among the plurality of pixels of an organic light emitting diode display according to an exemplary embodiment of the present disclosure.

FIG. 4 is a layout view of a transistor and a capacitor forming an outermost pixel PX2 among a plurality of pixels of the organic light emitting diode display according to the exemplary embodiment of the present disclosure, FIG. 5 is a detailed layout view of FIG. 4, FIG. 6 is a cross-sectional view of the organic light emitting diode of FIG. 5 taken along the line VI-VI, FIG. 7 is a cross-sectional view of the organic light emitting diode of FIG. 5 taken along the lines VII-VII and VII'-VII', and FIG. 8 is a schematic layout view of a semiconductor and a dummy semiconductor of the outermost pixel PX2 among the plurality of pixels of the organic light emitting diode display according to the exemplary embodiment of the present disclosure.

Hereinafter, the detail plane structure of the organic light emitting diode display according to the exemplary embodiment of the present disclosure will first be described with reference FIGS. 4, 5, and 8 and the detailed section structure will be described with reference to FIGS. 6 and 7.

First, as illustrated in FIG. 4, in the organic light emitting diode display according to the exemplary embodiment of the present disclosure, the pixel part P1 applies the scan signal Sn, the front end signal Sn−1, the light emission control light EM, and the bypass signal Bp, respectively, to the pixel PX. The pixel part P1 includes the scan line 151, the front end scan line 152, and the light emission control line 153, and the bypass control line 158 which are formed along a row direction. The pixel part P1 also includes the data line 171 and the driving voltage line 172 which intersect the scan line 151, the front end scan line 152, the light emission control line 153, and the bypass control line 158, and applies the data signal Dm and the driving voltage ELVDD to the pixel PX. In this case, the initialization voltage line 192 which transfers the initialization voltage Vint is formed while being bent plural times along the row direction. The initialization voltage Vint which is transferred from the initialization voltage line 192 is transferred to the compensation transistor T3 via the initialization transistor T4.

Further, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode. The organic light emitting diode includes a pixel electrode 191, an organic emission layer 370, and a common electrode 270. In this case, the compensation transistor T3 and the initialization transistor T4 have a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor T7 is formed inside one connected semiconductor 130 which may be bent in various shapes.

As illustrated in FIGS. 4 and 8, the semiconductor 130 is formed in a central pixel PX1 which is positioned at a central portion of the pixel part P1, and an outermost pixel PX2 which is at an outermost portion of the pixel part P1 is provided with the dummy semiconductor 30 which extends up to the peripheral part P2.

As such, the outermost pixel PX2 is provided with the dummy semiconductor 30 which extends up to the peripheral part P2 and thus a density of the semiconductor 130 of the central pixel PX1 is equal to that of the semiconductor 130 of the outermost pixel PX2. Therefore, a difference in amount of a developer used per unit area does not occur in the central pixel PX1 and the outermost pixel PX2 and therefore, it is possible to prevent the width of the semiconductor which is formed in the outermost pixel PX2 from thinning. As a result, it is possible to prevent the bright spots from occurring in the outermost pixel PX2.

The semiconductor 130 and the dummy semiconductor 30 may be made of polysilicon or oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the semiconductor 130 is made of the oxide semiconductor, a separate passivation layer may be added to protect the oxide semiconductor which is vulnerable to external environments, such as high temperature.

The semiconductor 130 includes a channel which is channel-doped with N-type impurity or P-type impurity and a source doping region and a drain doping region which are formed at both sides of the channel and have a doping concentration higher than that of the doping impurity which is doped in the channel. According to the exemplary embodiment of the present disclosure, each of the source doping region and the drain doping region correspond to the source electrode and the drain electrode, respectively. The source electrode and the drain electrode which are formed in the semiconductor 130 may be formed by doping only the corresponding region. Further, the region between the source electrodes and the drain electrodes of different transistors in the semiconductor 130 are doped, and thus the source electrodes may be electrically connected to the drain electrodes.

As illustrated in FIG. 4, a channel 131 which is formed in the semiconductor 130 includes a driving channel 131a which is formed in the driving transistor T1, a switching channel 131b which is formed in the switching transistor T2, a compensation channel 131c which is formed in the compensation transistor T3, an initialization channel 131d which is formed in the initialization transistor T4, an operation control channel 131e which is formed in the operation control transistor T5, a light emission channel 131f which is formed in the light emission control transistor T6, and a bypass channel 131g which is formed in the bypass transistor T7.

The driving transistor T1 includes the driving channel 131a, a driving gate electrode 155a, a driving source electrode 136a, and a driving drain electrode 137a. The channel 131a is bent and may have a snake shape or a zigzag shape. As such, the driving channel 131a is formed in the bent shape and a narrow space thereof may be extendedly formed along the driving channel 131a. Therefore, a driving range of the driving gate-source voltage Vgs between the driving gate electrode 155a and the driving source electrode 136a is widened by forming the driving channel 131a long. The driving range of the gate-source voltage Vgs means a difference between a maximum driving gate-source voltage of the driving transistor corresponding to maximum gray and a minimum driving gate-source voltage of the driving transistor corresponding to minimum gray or a difference between the driving gate-source voltages for each step for gray representation. Since the driving range of the driving gate-source voltage Vgs is wide, it is possible to more delicately adjust the gray value of light emitted from the organic light emitting diode (OLD) by changing a magnitude of gate voltage Vg which is applied to the driving gate electrode 155a, thereby increasing a resolution of the organic light emitting diode display and improving a display quality. The shape of the driving channel 131a may be variously changed and thus various exemplary shapes, such as 'reverse S', CS', 'M', W, and the like may be possible.

The driving gate electrode 155a overlaps the driving channel 131a and the driving source electrode 136a and the driving drain electrode 137a are each formed at both sides of the driving channel 131a, while being adjacent to each other. The driving source electrode 136a and the driving drain electrode 137a are positioned inside the semiconductor 130, similar to the driving channel 131a. The driving gate electrode 155a is connected to a driving connecting member 174 through a driving contact hole 61.

The switching transistor T2 includes a switching channel 131b, a switching gate electrode 155b, a switching source electrode 136b, and a switching drain electrode 137b. The switching gate electrode 155b which is some of the portion extending downward from the scan line 151 overlaps the switching channel 131b and the switching source electrode 136b and the switching drain electrode 137b are each formed at both sides of the switching channel 131b, while being adjacent to each other. The switching source electrode 136b and the switching drain electrode 137b are positioned inside the semiconductor 130, similar to the switching channel 131b. The switching source electrode 136b is connected to the data line 171 through a switching contact hole 62.

The compensation transistor T3 includes a compensation channel 131c, a compensation gate electrode 155c, a compensation source electrode 136c, and a compensation drain electrode 137c. The compensation gate electrode 155c is formed in two portions to prevent a current from being leaked and the two compensation gate electrodes 155c may each be a portion of the scan line 151 and a protrusion extending upward from the scan line 151. The compensation gate electrode 155c overlaps the compensation channel 131c and the compensation source electrode 136c and the compensation drain electrode 137c are each formed at both sides of the compensation channel 131c, while being adjacent to each other. The compensation source electrode 136c and the compensation drain electrode 137c are positioned inside the semiconductor 130, like the compensation channel 131c. The compensation drain electrode 137c is connected to the driving connecting member 174 through a compensation contact hole 63.

The initialization transistor T4 includes the initialization channel 131d, the initialization gate electrode 155d, the initialization source electrode 136d, and the initialization drain electrode 137d. The initialization gate electrode 155d is also formed in two portions to prevent a current from being leaked and the two initialization gate electrodes 155c may each be a portion of the front end scan line 152 and a protrusion extending downward from the front end scan line 152. The initialization gate electrode 155d overlaps the initialization channel 131d and the initialization source electrode 136d and the initialization drain electrode 137d are each formed at both sides of the initialization channel 131d, while being adjacent to each other. The initialization source electrode 136d and the initialization drain electrode 137d are positioned inside the semiconductor 130, similar to the initialization channel 131d. The initialization source electrode 136d is connected to the initialization connecting member 175 through an initialization contact hole 64 and the initialization drain electrode 137d is connected to the driving connecting member 174 through the initialization contact hole 64.

The operation control transistor T5 includes an operation control channel 131e, an operation control gate electrode 155e, an operation control source electrode 136e, and an operation control drain electrode 137e. The operation control gate electrode 155e which is a portion of the light emission control line 153 overlaps the operation control channel 131e and the operation control source electrode 136e and the operation control drain electrode 137e are each formed at both sides of the operation control channel 131e while being adjacent to each other. The operation control source electrode 136e and the operation control drain electrode 137e are positioned inside the semiconductor 130, similar to the operation control channel 131e. The operation control source electrode 136e is connected to a portion of the driving voltage line 172 through an operation control contact hole 65.

The light control transistor T6 includes a light emission control channel 131f, a light emission control gate electrode 155f, a light emission control source electrode 136f, and a light emission drain electrode 137f. The light emission control gate electrode 155f which is a portion of the light emission control line 153 overlaps the light emission control channel 131f. The light emission control source electrode 136f and the light emission control drain electrode 137f are each formed at both sides of the light emission control channel 131f while being adjacent to each other. The light emission control source electrode 136f and the light emission control drain electrode 137f are positioned inside the semiconductor 130, similar to the light emission control channel 131f. The light emission control drain electrode 137f is connected to the light emission control connecting member 179 through the light emission control contact hole 66.

The bypass transistor T7 includes a bypass channel 131g, a bypass gate electrode 155g, a bypass source electrode 136g, and a bypass drain electrode 137g. The bypass gate electrode 155g which is a portion of the bypass control line 158 overlaps the bypass channel 131g and the bypass source electrode 136g. The bypass drain electrode 137g are each formed at both sides of the bypass channel 131g, while being adjacent to each other. The bypass source electrode 136g and the bypass drain electrode 137g are positioned inside the semiconductor 130, similar to the bypass channel 131g. The bypass source electrode 136g is connected to the light emitting control connecting member 179 through a light control contact hole 66 and the bypass drain electrode 137g is directly connected to the initialization source electrode 136d.

The driving source electrode 136a of the driving transistor T1 is connected to the switching drain electrode 137b and the operation control drain electrode 137e and the driving control drain electrode 137a are connected to the compensation source electrode 136c and the light emission control source electrode 136f.

The capacitor Cst includes a first storage electrode 155a and a second storage electrode 156, and a second gate insulating layer 142 disposed therebetween. The first storage electrode 155a corresponds to the driving gate electrode 155a. The second storage electrode 156 is a portion extending from the storage line 154 and occupies an area wider than that of the driving gate electrode 155a and completely covers the driving gate electrode 155a. Here, the second gate insulating layer 142 is a dielectric material and storage capacitance is determined by a charge in the storage capacitor Cst and a voltage between both electrodes 155a and 156. As such, the driving gate electrode 155a is used as the first storage electrode 155a, and thus a space in which the storage capacitor may be formed may be secured in a space narrowing due to the driving channel 131a occupying a large area within the pixel.

The first storage electrode 155a which is the driving gate electrode 155a is connected to one end of the driving connecting member 174 through the driving contact hole 61 and the storage opening 51. The storage opening 51 is an opening which is formed in the second storage electrode 156.

The driving connecting member 174 is formed on the same layer to be approximately parallel with the data line 171 and the other end of the driving connecting member 174 is connected to the compensation drain electrode 137c of the compensation transistor T3 and the initialization drain electrode 137d of the initialization transistor T4 through the compensation contact hole 63. Therefore, the driving connecting member 174 connects between the driving gate electrode 155a and the compensation drain electrode 137c of the compensation transistor T3 and the initialization drain electrode 137d of the initialization transistor T4.

The second storage electrode 156 is connected to the driving voltage line 172 through a storage contact hole 69. Therefore, the storage capacitor Cst stores the storage capacitance corresponding to the difference between the driving voltage ELVDD transferred to the second storage electrode 156 through the driving voltage line 172 and the driving gate voltage Vg of the driving gate electrode 155a.

Hereinafter, the section structure of the organic light emitting diode display according to the exemplary embodiment of the present disclosure will be described in detail according to the stacked order with reference to FIGS. 6 and 7.

In this case, the operation control transistor T5 is substantially the same as the stacked structure of the light emission control transistor T6 and therefore a detailed description thereof will be omitted.

A buffer layer 120 is formed on the substrate 110. The substrate 110 may be formed as an insulating substrate which is made of glass, quartz, ceramic, plastic, or the like. The buffer layer 120 serves to block impurity from the substrate 110 to improve characteristics of polysilicon at the time of the crystallization process for forming polysilicon and planarize the substrate 110 to mitigate stress of the semiconductor formed on the buffer layer 120. The buffer layer 120 may be made of silicon nitride (SiNx), silicon oxide $SiO_2$, or the like.

The semiconductor, which includes the driving channel 131a, the switching channel 131b, the compensation channel 131c, the initialization channel 131d, the operation control channel 131e, the light emission channel 131f, and the bypass channel 131g, is formed on the buffer layer 120. The driving source electrode 136a and the driving drain electrode 137a are formed at both sides of the driving channel 131a among the semiconductor 130 and the switching source electrode 136b. The switching drain electrode 137b are formed at both sides of the switching channel 131b. Further, the compensation source electrode 136c and the compensation drain electrode 137c are formed at both sides of the compensation channel 131c. Also, the initialization source electrode 136d and the initialization drain electrode 137d are formed at both sides of the initialization channel 131. Further, the operation control source electrode 136e and the operation control drain electrode 137e are formed at both sides of the operation control channel 131e. The light emission control source electrode 136f and the light emission control drain electrode 137f are formed at both sides of the light emission control channel 131f. The bypass source electrode 136g and the bypass drain electrode 137g are formed at both sides of the bypass channel 131g.

A first gate insulating layer 141, which is a first insulating layer, is formed on the semiconductor 130 to cover the semiconductor 130. The scan line 151 including the switching gate electrode 155b and the compensation gate electrode 155c, the front end scan line 152 including the initialization gate electrode 155d, the light emission control line 153 including the operation control gate electrode 155e and the light emission control gate electrode 155f, the bypass control line including the bypass gate electrode 155g, and the first gate wirings 151, 152, 153, 155a, and 158 including the driving gate electrode (first storage electrode) 155a are formed on the first gate insulating layer 141.

The first gate wirings 151, 152, 153, 155a, and 158 may be formed in a multilayer in which metal layers made of any one of copper (Cu), copper alloy, aluminum (Al), aluminum alloy, molybdenum (Mo), and molybdenum alloy are stacked.

The second gate insulating layer 142, which is a second insulating layer, is formed on the first gate wirings 151, 152, 153, 155a, and 158 and the first gate insulating layer 141 to cover the first gate wirings 151, 152, 153, 155a, and 158 and the first gate insulating layer 141.

The first gate insulating layer 141 and the second gate insulating layer 142 may be made of silicon nitride (SiNx), silicon oxide $SiO_2$, or the like.

The storage line 154 which is disposed in parallel with the scan line 151, and the second gate wirings 154 and 156 including the second storage electrode 156 which is a portion extending from the storage line 154 are formed on the second gate insulating layer 142.

An interlayer insulating layer 160, which is a third insulating layer, is formed on the second gate insulating layer 142 and the second gate wirings 154 and 156. The contact holes 61, 62, 63, 64, 65, 66, 69, which include the driving contact hole 61, the switching contact hole 62, the compensation contact hole 63, the initialization contact hole 64, the operation control contact hole 65, the light emission control contact hole 66, and the storage contact hole 69, are formed on the interlayer insulating layer 160. The interlayer insulating layer 160 may be made of silicon nitride (SiNx) or silicon oxide $SiO_2$, or the like.

The data wirings 171, 172, 175, and 179 including the data line 171, the driving voltage line 172, the driving connecting member 174, the initialization connecting member 175, and the light emission control connecting member 179 are formed on the interlayer insulating layer 160.

The data line 171 is connected to the switching source electrode 136b through the switching contact hole 62 which is formed on the first gate insulating layer 141, the second gate insulating layer 142, and the interlayer insulating layer 160, having the same boundary line, one end of the driving connecting member 174 is connected to the first storage electrode 155a through the driving contact hole 61 which is formed on the second gate insulating layer 142 and the interlayer insulating layer 160, having the same boundary line, and the other end of the driving connecting member 174 is connected to the compensation drain electrode 137c and the initialization drain electrode 137d through the compensation contact hole 63 which is formed on the first gate insulating layer 141, the second gate insulating layer 142, and the interlayer insulating layer 160, having the same boundary line.

The initialization connecting member 175 is connected to the initialization source electrode 136d through the initialization contact hole 64 which is formed on the first gate insulating layer 141, the second gate insulating layer 142, and the interlayer insulating layer 160 together. Further, the light emission control connecting member 179 is connected to the light emission control drain electrode 137f through the light emission control contact hole 66 which is formed on the first gate insulating layer 141, the second gate insulating layer 142, and the interlayer insulating layer 160 together.

The data wirings 171, 172, 175, and 179 may be formed in a multilayer in which metal layers are made of any one of copper (Cu), copper alloy, aluminum (Al), aluminum alloy, molybdenum (Mo), and molybdenum alloy are stacked. For example, the data wirings 171, 172, 175, and 179 are formed of a triple layer of titanium/aluminum/titanium (Ti/Al/Ti), molybdenum/aluminum/molybdenum (Mo/Al/Mo), a triple layer of molybdenum/copper/molybdenum (Mo/Cu/Mo), or the like.

A passivation layer 180 is formed on the data wirings 171, 172, 175, and 179 and the interlayer insulating layer 160 to cover the data wirings 171, 172, 175, and 179 and the interlayer insulating layer 160. The passivation layer 180 covers and planarizes the data wirings 171, 172, 174, and 179 and therefore the pixel electrode 191 may be formed on the passivation layer 180 without a step. Further, the passivation layer 180 is formed to have a thickness thicker than that of the interlayer insulating layer 160, thereby minimizing the parasitic capacitance between the data wirings 171, 172, 175, and 179 and the pixel electrode 191. The passivation layer 180 may be formed from a stacked layer of an organic material such as polyacrylates resin, polyimides resin, or the like or a stacked layer of an organic material and an inorganic material.

The pixel electrode 191 and an initialization voltage line 192 are formed on the passivation layer 180. The light emission connecting member 179 is connected to the pixel electrode 191 through the pixel contact hole 81 which is formed on the passivation layer 180 and the initialization connecting member 175 is connected to the initialization voltage line 192 through the initialization voltage contact hole 82 which is formed on the passivation layer 180.

A pixel defined layer (PDL) 350 is formed on the passivation layer 180, the initialization voltage line 192, and an edge of the pixel electrode 191 to cover the passivation layer 180, the initialization voltage line 192, and the edge of the pixel electrode 191. The pixel defined layer 350 has a pixel opening 351 through which the pixel electrode 191 is exposed. The pixel defined layer 350 may be made of organic materials such as polyacrylates resin, polyimides resin, and the like and silica-based organic materials.

An organic emission layer 370 is formed on the pixel electrode 191 exposed through the pixel opening 351 and the common electrode 270 is formed on the organic emission layer 370. The common electrode 270 is also formed on the pixel defined layer 350 and thus is formed over the plurality of pixels PXs. As such, the organic light emitting diode (OLD) including the pixel electrode 191, the organic emission layer 370, and the common electrode 270 is formed.

Here, the pixel electrode 191 is an anode which is a hole injection electrode and the common electrode 270 is a cathode which is an electron injection electrode. However, the exemplary embodiment of the present disclosure is not necessarily limited thereto and depending on a driving method of the organic light emitting diode display, the pixel electrode 191 may be the cathode and the common electrode 270 may be the anode. Holes and electrons are each injected from the pixel electrode 191 and the common electrode 270 into the organic emission layer 370 and light is emitted when excitons, which are a combination of the injected holes and electrons, fall from an excited state to a ground state.

The organic emission layer 370 may be made of a low molecular organic material or a high molecular organic material such as poly 3,4-ethylenedioxythiophene (PEDOT), or the like. Further, the organic light emitting layer 370 is formed of a multilayer which includes at least one of a light emitting layer, a hole injection layer (HIL), a hole transporting layer (HTL), an electron transporting layer (ETL), and an electron-injection layer (EIL). The hole injection layer is disposed on the pixel electrode 191 which is a cathode and the hole transporting layer, the light emitting layer, the electron transporting layer, and the electron injection layer are sequentially stacked thereon.

The organic light emitting layer 370 may include a red organic light emitting layer which emits red light, a green organic light emitting layer which emits green light, and a blue organic light emitting layer which emits blue light, in which the red organic light emitting layer, the green organic light emitting layer, and the blue organic light emitting layer are each formed in a red pixel, a green pixel, and a blue pixel, respectively to implement a color image.

Further, the organic light emitting layer 370 may implement the color image by stacking the red organic light emitting layer, the green organic light emitting layer, and the blue organic light emitting layer in all of the red pixel, the green pixel, and the blue pixel, respectively and forming a red filter, a green filter, and a blue filter for each pixel. As another example, the color image may be implemented by forming a white organic light emitting layer which emits white light in all of the red pixel, the green pixel, and the blue pixel and forming a red filter, a green filter, and a blue filter for each pixel. At the time of implementing the color image using the white organic light emitting layer and the color filters, there is no need to use a deposition mask for depositing the red organic light emitting layer, the green organic light emitting layer, and the blue organic light emitting layer on each pixel, that is, the red pixel, the green pixel, and the blue pixel.

The white organic light emitting layer described in another example may be formed of a single organic light emitting layer and may include components to emit white light by stacking the plurality of organic light emitting layers. For example, the white organic light emitting layer may also include a configuration to emit white light by combining at least one yellow organic light emitting layer with at least one blue organic light emitting layer, a configuration to emit white light by combining at least one cyan organic light emitting layer with at least one red organic light emitting layer, or a configuration to emit white light by combining at least one magenta organic light emitting layer with at least one green organic light emitting layer, and the like.

An encapsulation member (not illustrated) protecting the organic light emitting diode (OLD) may be formed on the common electrode 270 and may be formed on the substrate 110 by a sealant and may be made of various materials such as glass, quartz, ceramic, plastic, metal, and the like. Meanwhile, a thin film encapsulation layer may be formed on the common electrode 270 without the sealant by alternately disposing an organic layer and an inorganic layer.

Meanwhile, according to the exemplary embodiment of the present disclosure, only the dummy semiconductor is formed to intercept the loading effect. However, another exemplary embodiment for alleviating a load effect by additionally forming the dummy pixel in which some components including the pixel electrode is omitted is also possible.

Hereinafter, the organic light emitting diode display according to another exemplary embodiment of the present disclosure will be described with reference to FIGS. 9 to 13.

Figure 9:
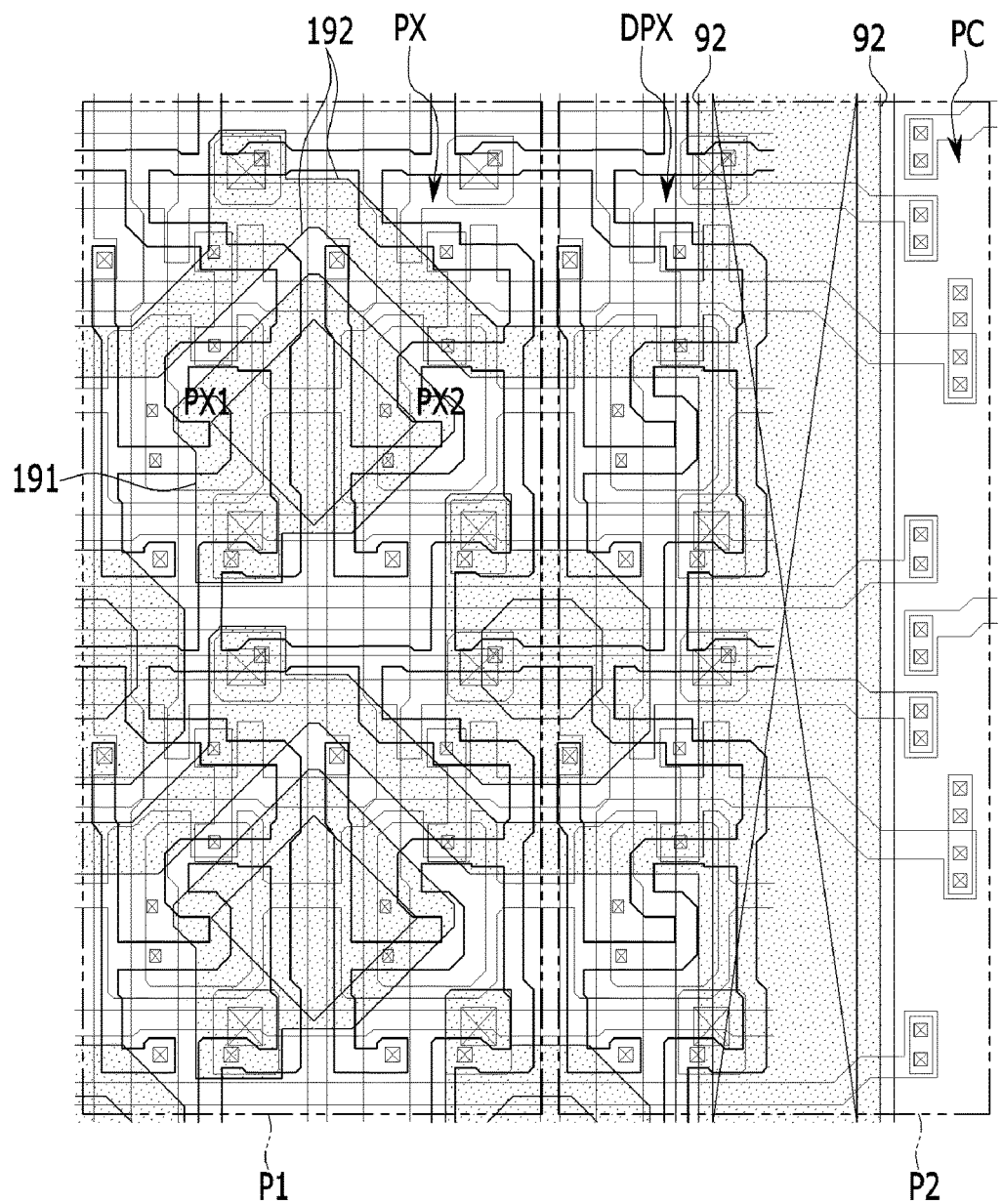
FIG. 9 is a schematic layout view of the pixel part and a peripheral part of an organic light emitting diode display according to an exemplary embodiment of the present disclosure.
Figure 10:
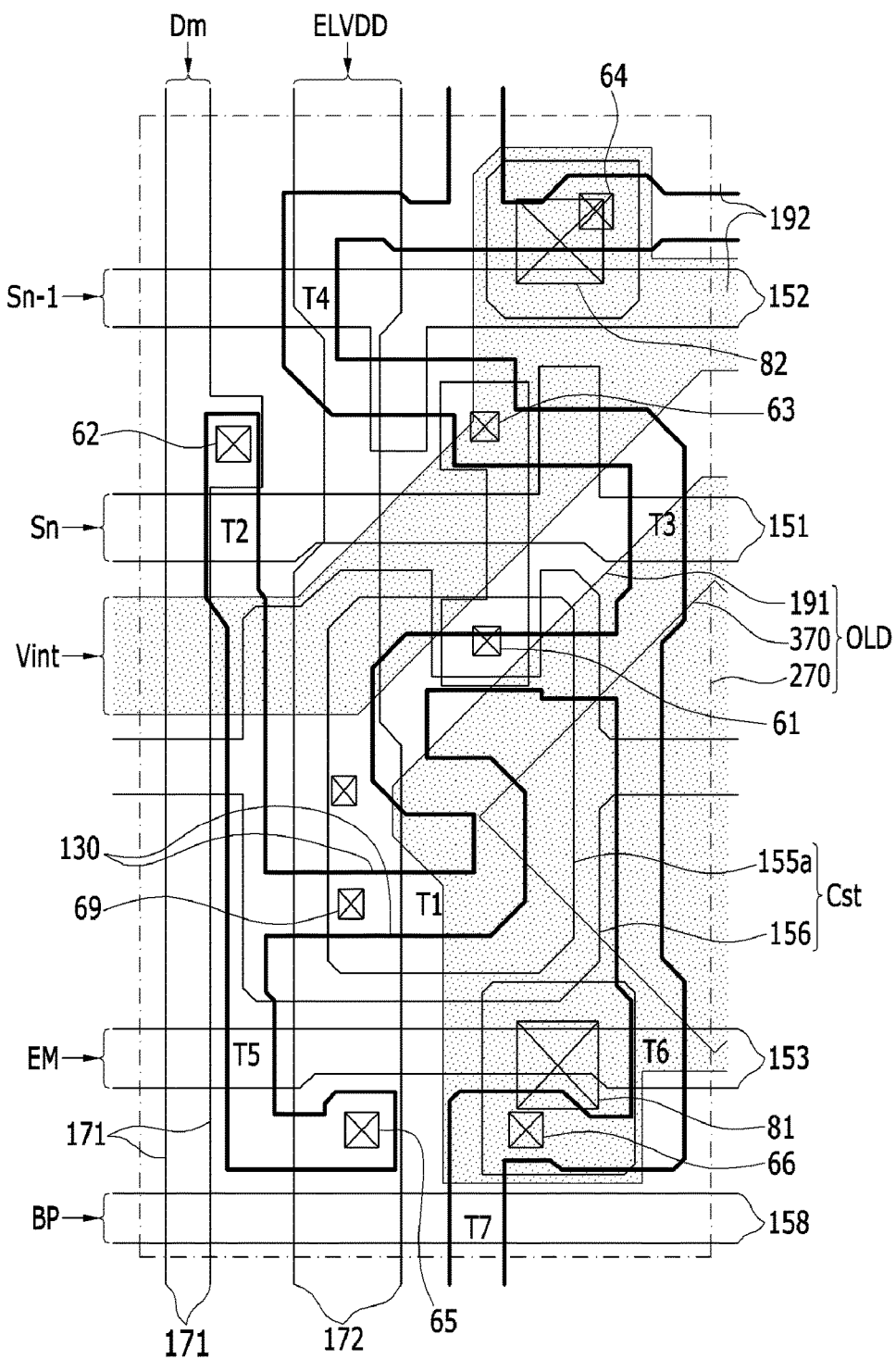
FIG. 10 is a diagram schematically illustrating a plurality of transistors and a capacitor of an organic light emitting diode display according to another exemplary embodiment of the present disclosure.
Figure 11:
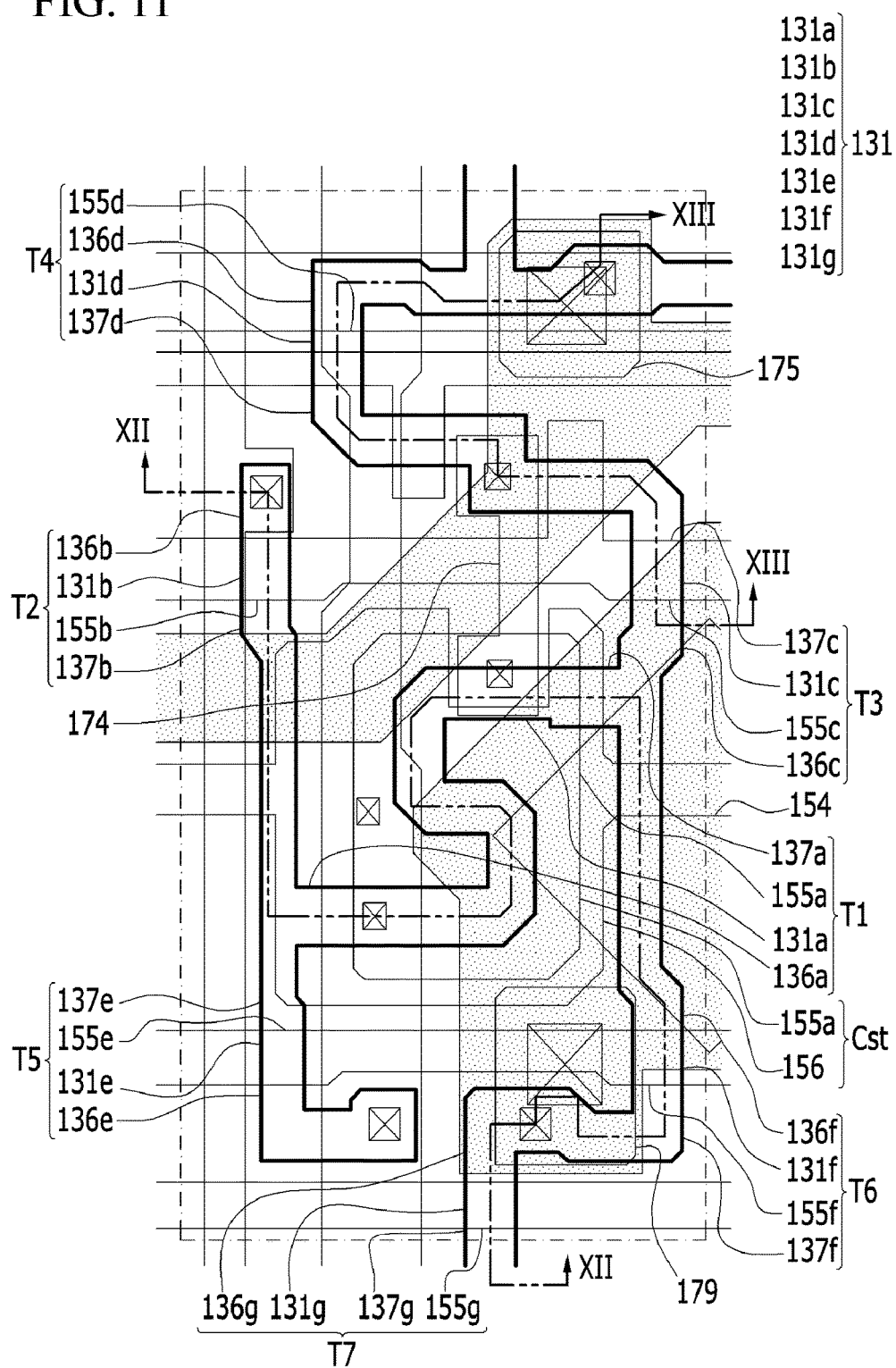
FIG. 11 is a detailed layout view of FIG. 10.
Figure 12:
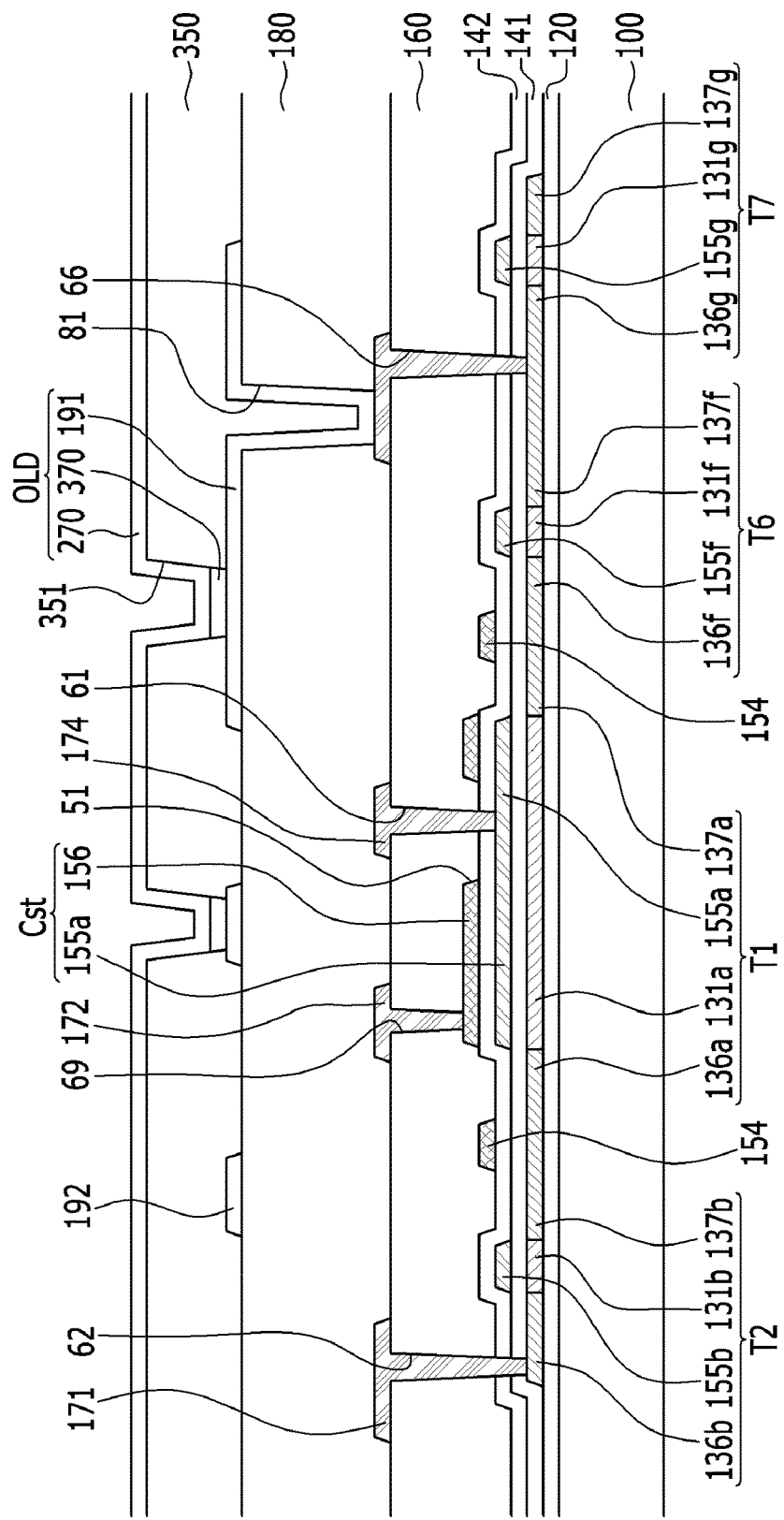
FIG. 12 is a cross-sectional view of the organic light emitting diode of FIG. 11 taken along the line XII-XII.
Figure 13:
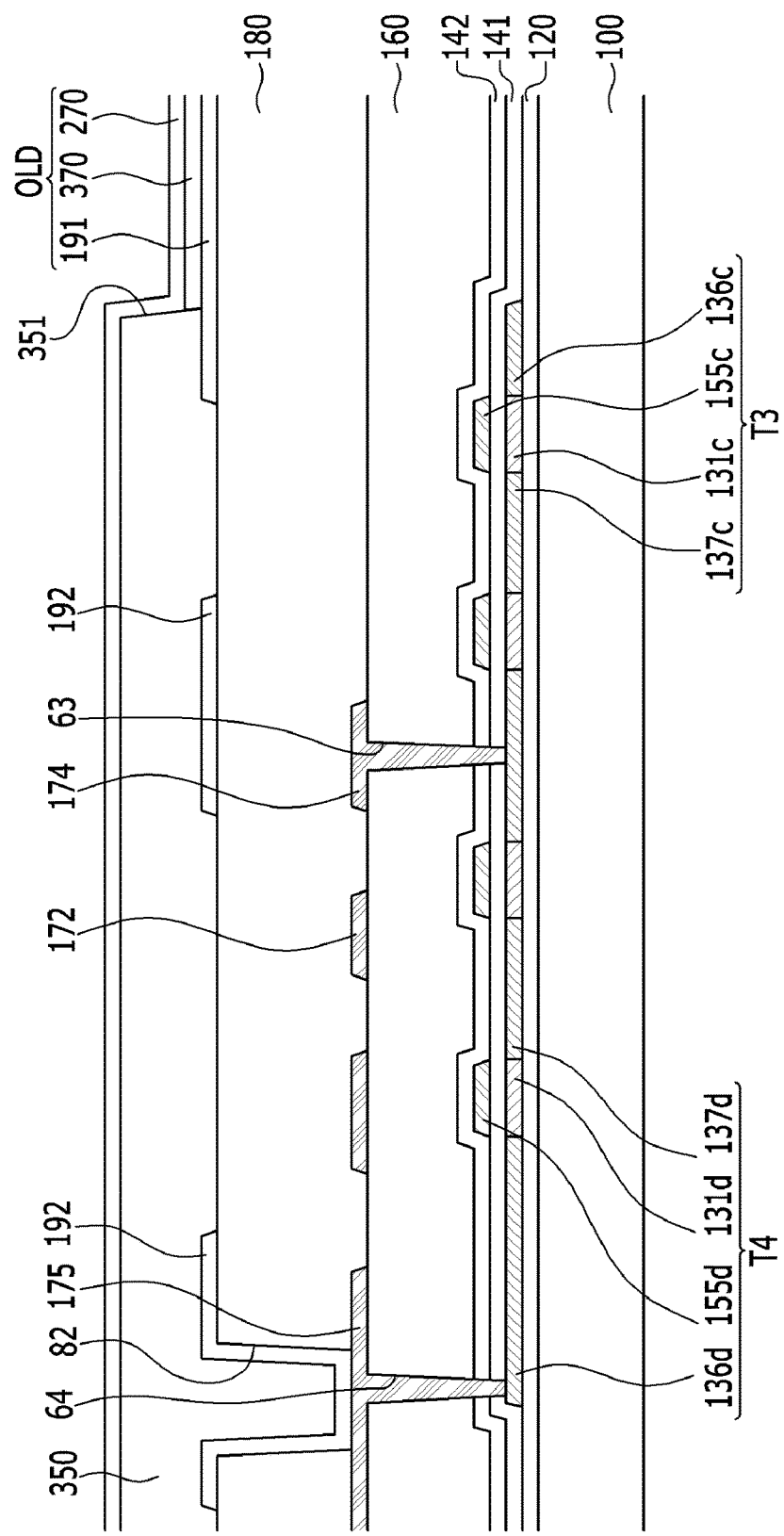
FIG. 13 is a cross-sectional view of the organic light emitting diode of FIG. 11 taken along the line XIII-XIII.

FIG. 9 is a schematic layout view of the pixel part and a peripheral part of the organic light emitting diode display according to the exemplary embodiment of the present disclosure, FIG. 10 is a diagram schematically illustrating a plurality of transistors and a capacitor of an organic light emitting diode display according to another exemplary embodiment of the present disclosure, FIG. 11 is a detailed layout view of FIG. 10, FIG. 12 is a cross-sectional view of the organic light emitting diode of FIG. 11 taken along the line XII-XII, and FIG. 13 is a cross-sectional view of the organic light emitting diode of FIG. 11 taken along the line XIII-XIII.

Another exemplary embodiment of the present disclosure illustrated in FIGS. 9 to 13 is substantially the same as the exemplary embodiment of the present disclosure illustrated in FIGS. 1 to 8, except for the structure of the dummy pixel and the way the dummy pixel overlaps the initialization bus line.

As shown in FIG. 9, the organic light emitting diode display according to another exemplary embodiment of the present disclosure includes the pixel part P1 in which the plurality of pixels PXs is formed, and the peripheral part P2 which encloses the pixel part P1. The OLD display is provided with a plurality of dummy pixels DPXs, an initialization bus line 92, and a plurality of peripheral circuits PCs. The plurality of pixels PXs which is formed in the pixel part P1 includes an outermost pixel PX2 which is formed at the outermost portion of the pixel part P1, and a central pixel PX1 which is formed inside the outermost pixel PX2.

Unlike the pixel PX which is formed in the pixel part P1, the dummy pixel DPX which is formed in the peripheral part P2 is not provided with the pixel electrode 191 and the organic emission layer 370. That is, the dummy pixel DPX is provided with only the plurality of transistors T1, T2, T3, T4, T5, T6, and T7 and the capacitor Cst and therefore does not emit light.

As a result, the density of the outermost pixel PX2 which is formed at the outermost portion of the pixel part P1 is equal to that of the central pixel PX1 which is formed at the central portion of the pixel part P1. Therefore, the difference in amount of a developer used per unit area does not occur in the central pixel PX1 and the outermost pixel PX2 and thus, it is possible to prevent the width of the semiconductor which is formed in the outermost pixel PX2 from thinning. As a result, it is possible to prevent the bright spots from occurring in the outermost pixel PX2.

Further, the dummy pixel DPX overlaps the initialization bus line 92 which is connected to the initialization voltage line 192. Therefore, a separate space for forming the dummy pixel DPX is not required, and thus another exemplary embodiment of the present disclosure may be applied to the high resolution structure.

As illustrated in FIGS. 10 to 13, the organic light emitting diode display according to the exemplary embodiment of the present disclosure applies the scan signal Sn, the front end signal Sn−1, the light emission control light EM, and the bypass signal Bp, respectively, and includes the scan line 151, the front end scan line 152, and the light emission control line 153, and the bypass control line 158 which are formed along a row direction. Further, the pixel part P1 includes the data line 171 and the driving voltage line 172 which intersect the scan line 151, the front end scan line 152, the light emission control line 153, and the bypass control line 158 and applies the data signal Dm and the driving voltage ELVDD to the pixel 1. The initialization voltage Vint is transferred from the initialization voltage line 192 to the compensation transistor T3 via the initialization transistor T4.

Further, the pixel PX is provided with the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode (OLD). The organic light emitting diode (OLD) includes a pixel electrode 191, an organic emission layer 370, and a common electrode 270. In this case, the compensation transistor T3 and the initialization transistor T4 are configured of a transistor having a dual gate structure to cut off a leakage current.

The light emission connecting member 179 is connected to the pixel electrode 191 through the pixel contact hole 81 and the initialization connecting member 175 is connected to the initialization voltage line 192 through the initialization voltage contact hole 82. The initialization voltage line 192 is generally connected to the initialization bus line 92 which is formed at the peripheral part P2.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

| Description of symbols |
| --- |
| 131a: Driving channel |
| 132b: Switching channel |
| 141: First gate insulating layer |
| 142: Second gate insulating layer |
| 151: Scan line |
| 152: Front end scan line |
| 153: Light emission control line |
| 158: Bypass control line |
| 155a: Driving gate electrode |
| 155b: Switching gate electrode |
| 156: Second storage electrode |

| Description of symbols |
| --- |
| 157: Storage line |
| 160: Interlayer insulating layer |
| 171: Data line |
| 172: Driving voltage line |
| 174: Driving connecting member |
| 175: Initialization connecting member |
| 179: Emission control connecting member |
| 180: Passivation layer |
| 191: Pixel electrode |
| 192: Initialization voltage line |
| 270: Common electrode |
| 350: Pixel defined layer |
| 370: Organic emission layer |

What is claimed is:

1. An organic light emitting diode display comprising:
   a substrate comprising a displaying area and a peripheral area having a peripheral circuit;
   a scan line on the substrate for transferring a scan signal;
   a data line for transferring a data voltage;
   a switching transistor connected to the scan line and the data line;
   a driving transistor connected to the switching transistor and comprising a semiconductor;
   an organic light emitting diode electrically connected to the driving transistor;
   an initialization bus line positioned between the peripheral circuit and the organic light emitting diode in a plane view; and
   a dummy semiconductor that overlaps the initialization bus line in the plane view and is connected to the semiconductor of the driving transistor.

2. The organic light emitting diode display of claim 1, further comprising:
   a dummy switching transistor connected to the scan line and the data line, and
   a dummy driving transistor connected to the dummy switching transistor.

3. The organic light emitting diode display of claim 2, wherein
   the dummy switching transistor comprises
   a dummy switching channel at the dummy semiconductor,
   a dummy switching gate electrode at the same layer as the scan line and overlapping the dummy switching channel, and
   a dummy switching source electrode and a dummy switching drain electrode located at respective sides of the dummy switching channel.

4. The organic light emitting diode display of claim 2, wherein
   the dummy driving transistor comprises
   a dummy driving channel at the dummy semiconductor,
   a dummy driving gate electrode at the same layer as the scan line and overlapping the dummy driving channel, and
   a dummy driving source electrode and a dummy driving drain electrode located at respective sides of the dummy driving channel.

5. The organic light emitting diode display of claim 2, further comprising:
   a front end scan line arranged in parallel with the scan line, the front end scan line being for transferring a front end scan signal, an initialization voltage line extended from the initialization bus line and positioned in the displaying area for transferring an initialization voltage, and an initialization transistor between the initialization voltage line and a driving gate electrode of the driving transistor, which is turned on depending on the front end scan signal to transfer the initialization voltage to the driving gate electrode.

6. An organic light emitting diode display comprising:
a substrate comprising a displaying area and a peripheral area having a peripheral circuit;
a scan line on the substrate for transferring a scan signal;
a data line for transferring a data voltage;
a switching transistor connected to the scan line and the data line;
a driving transistor connected to the switching transistor and comprising a semiconductor;
an organic light emitting diode electrically connected to the driving transistor;
an initialization bus line positioned between the peripheral circuit and the organic light emitting diode in a plane view; and
a dummy semiconductor that overlaps the initialization bus line in the plane view and is connected to the semiconductor of the driving transistor, wherein
any organic light emitting diode does not overlap the dummy semiconductor in the plane view.

7. The organic light emitting diode display of claim 1, wherein
the organic light emitting diode comprises
a pixel electrode electrically connected to the driving transistor,
an organic emission layer on the pixel electrode, and
a common electrode on the organic emission layer.

8. An organic light emitting diode display comprising:
a substrate comprising a displaying area and a peripheral area having a peripheral circuit;
a scan line on the substrate for transferring a scan signal;
a data line for transferring a data voltage;
a switching transistor connected to the scan line and the data line;
a driving transistor connected to the switching transistor and comprising a semiconductor;
an organic light emitting diode electrically connected to the driving transistor;
an initialization bus line positioned between the peripheral circuit and the organic light emitting diode in a plane view; and
a dummy semiconductor that overlaps the initialization bus line in the plane view and is connected to the semiconductor of the driving transistor,
wherein the organic light emitting diode comprises:
a pixel electrode electrically connected to the driving transistor,
an organic emission layer on the pixel electrode, and
a common electrode on the organic emission layer, wherein
the dummy semiconductor does not overlap the pixel electrode and the organic emission layer in the plane view.

9. An organic light emitting diode display comprising:
a substrate comprising a displaying area and a peripheral area having a peripheral circuit;
a scan line on the substrate for transferring a scan signal;
a data line for transferring a data voltage;
a switching transistor connected to the scan line and the data line;
a driving transistor connected to the switching transistor and comprising a semiconductor;
an organic light emitting diode electrically connected to the driving transistor;
an initialization bus line positioned between the peripheral circuit and the organic light emitting diode in a plane view; and
a dummy semiconductor that overlaps the initialization bus line in the plane view and is connected to the semiconductor of the driving transistor, wherein
the dummy semiconductor is extended from the semiconductor of the driving transistor.

10. An organic light emitting diode display comprising:
a substrate comprising a displaying area and a peripheral area having a peripheral circuit;
a scan line on the substrate for transferring a scan signal;
a data line for transferring a data voltage;
a switching transistor connected to the scan line and the data line;
a driving transistor connected to the switching transistor and comprising a semiconductor;
an organic light emitting diode electrically connected to the driving transistor;
an initialization bus line positioned between the peripheral circuit and the organic light emitting diode in a plane view; and
a dummy semiconductor that overlaps the initialization bus line in the plane view and is connected to the semiconductor of the driving transistor, wherein
the displaying area comprises a central pixel and a outermost pixel, and
the dummy semiconductor is extended from the semiconductor of the driving transistor in the outermost pixel.

11. The organic light emitting diode display of claim 10, wherein
a semiconductor density of the central pixel is equal to that of the outermost pixel.

12. The organic light emitting diode display of claim 1, further comprising:
a driving voltage line crossing the scan line, the driving voltage line being for transferring a driving voltage.

* * * * *